(12) United States Patent
Madhavan et al.

(10) Patent No.: US 7,880,229 B2
(45) Date of Patent: Feb. 1, 2011

(54) BODY TIE TEST STRUCTURE FOR ACCURATE BODY EFFECT MEASUREMENT

(75) Inventors: Sriram Madhavan, Santa Clara, CA (US); Qiang Chen, Cupertino, CA (US); Darin A. Chan, Campbell, CA (US); Jung-Suk Goo, Los Altos, CA (US)

(73) Assignee: GlobalFoundries Inc., Grand Cayman (KY)

( * ) Notice: Subject to any disclaimer, the term of this patent is extended or adjusted under 35 U.S.C. 154(b) by 482 days.

(21) Appl. No.: 11/874,454

(22) Filed: Oct. 18, 2007

(65) Prior Publication Data

US 2009/0101976 A1 Apr. 23, 2009

(51) Int. Cl.
*H01L 27/12* (2006.01)
(52) U.S. Cl. .............................. 257/347; 257/E27.111; 257/E21.631
(58) Field of Classification Search .................. 257/347, 257/E27.111, E21.631, 349, 48, E21.531, 257/E23.002
See application file for complete search history.

(56) References Cited

U.S. PATENT DOCUMENTS 6,455,894 B1* 9/2002 Matsumoto et al. ......... 257/347
2007/0215939 A1* 9/2007 Xu et al. ..................... 257/336

* cited by examiner

*Primary Examiner*—Thomas L Dickey
*Assistant Examiner*—Fazli Erdem
(74) *Attorney, Agent, or Firm*—Ingrassia Fisher & Lorenz, P.C.

(57) ABSTRACT

A body tie test structure and methods for its manufacture are provided. The transistor comprises a body-tied semiconductor on insulator (SOI) transistor formed in a layer of semiconductor material, the transistor comprising a cross-shaped gate structure with a substantially constant gate length L. An insulating blocking layer enables formation of a spacer region in the layer of semiconductor material separating the source and drain regions from the body tie region. A conductive channel with substantially the same inversion characteristics as the intrinsic transistor body connects the body tie to the intrinsic transistor body through the spacer region.

12 Claims, 8 Drawing Sheets

BODY TIE TEST STRUCTURE FOR ACCURATE BODY EFFECT MEASUREMENT

TECHNICAL FIELD

The present invention generally relates to a method for fabricating semiconductor on insulator ("SOI") devices, and more particularly relates to a method for fabricating SOI transistors having a tied body terminal.

BACKGROUND

Designers of integrated circuits rely upon computer simulation models to predict the behavior of transistor devices in silicon. The failure of a computer simulation model to accurately predict actual circuit behavior could result in a non-working design or a design that does not perform to specification, potentially resulting in costly design iteration. Accordingly, it is desirable for device manufacturers to publish accurate simulation models so that devices perform as modeled.

In developing a computer simulation model of a transistor, model parameters are often observed empirically, by physically constructing the device to be modeled and then measuring the circuit's output response to applied input voltages and/or waveforms. A particular model parameter of interest is a transistor's body effect. The body effect can be measured indirectly by observing a transistor circuit's behavior while varying a bias voltage applied to the transistor's body terminal. If the transistor device is a floating body device with no body terminal, it is not possible to apply a bias voltage to the device's body to measure the body effect of the device. The traditional solution to this limitation is to mimic the floating body transistor using an equivalent transistor device that has a body tie. A drawback of the traditional solution is that the conventional body tie distorts the bias voltage applied to the transistor body, so the actual bias voltage applied to the transistor body is not known. This leads to a reduction in the accuracy of the transistor's computer simulation model. By constructing a body tie test structure that reduces or eliminates the body bias distortion seen in the conventional body tie design, a more accurate computer simulation model for a floating body transistor can be realized.

BRIEF SUMMARY

A method and apparatus are provided for the accurate determination of the body effect of a floating body transistor device. By constructing a body tie test structure, comprising a body tied transistor with a body tie that contributes little or no distortion to the applied body bias voltage seen at the transistor body, the body tie test structure can be used to accurately characterize the body effect of the equivalent floating body transistor.

The above and other aspects of the invention may be carried out in one embodiment by a body tie test structure comprising a body-tied transistor device with a cross-shaped gate and corresponding cross-shaped body region, the cross-shaped gate having a substantially constant gate length throughout.

A method is provided for manufacturing such a body tie test structure. A body tie test structure may be fabricated in a layer of semiconductor material using conventional manufacturing techniques for gate stack formation, halo ion implantation, insulating layer formation, and ion implantation in the layer of semiconductor material to form source, drain, and body tie regions.

A body tie test structure is provided that contributes little or no distortion to a voltage applied at the body tie as seen at the transistor body. The lack of distortion allows the body tie test structure to be used to accurately characterize the body effect of the equivalent floating body transistor. The body tie test structure comprises source, drain, and body tie regions, a spacer region, and a cross-shaped body region, each region being formed in a layer of semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a schematic illustration, in top view and cross sections, of a conventional body tied transistor device;

FIGS. 2-7 illustrate schematically, in top view and cross sections, one embodiment of a body-tied transistor device and a related manufacturing process; and FIG. 8 illustrates schematically, in top view and cross sections, a body-tied transistor device in accordance with a further embodiment of the invention.

DETAILED DESCRIPTION

The following detailed description is merely illustrative in nature and is not intended to limit the embodiments of the invention or the application and uses of such embodiments. Furthermore, there is no intention to be bound by any expressed or implied theory presented in the preceding technical field, background, brief summary or the following detailed description.

As used herein, the term "semiconductor material" will be used to encompass the relatively pure monocrystalline silicon materials typically used in the semiconductor industry as well as silicon admixed with other elements such as germanium, carbon, and the like to form substantially monocrystalline semiconductor material.

Figure 1A:
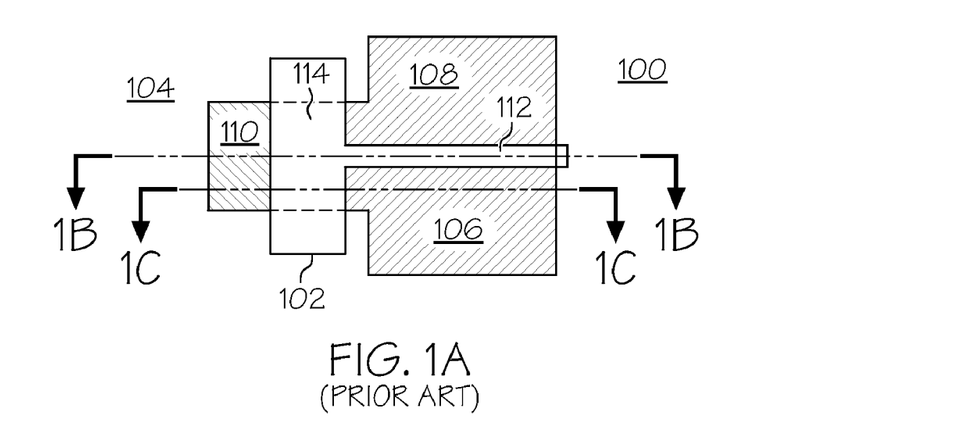
Figure 1B:
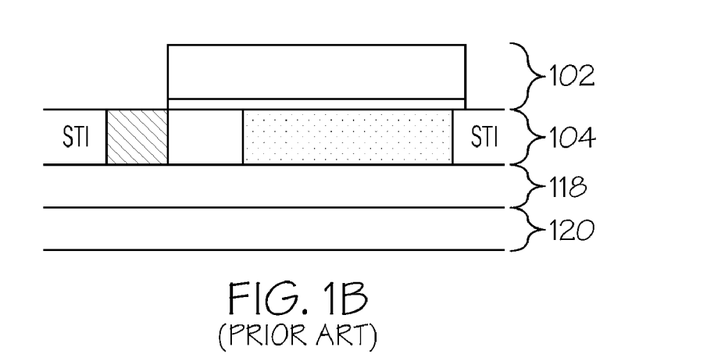
Figure 1C:
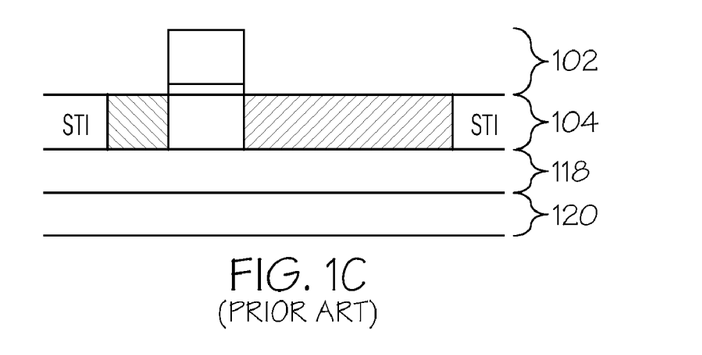

FIG. 1a shows a top view of a conventional body-tied semiconductor on insulator ("SOI") transistor device 100. FIG. 1b is a cross sectional view of device 100 as viewed from line b-b, and FIG. 1c is a cross sectional view of device 100 as viewed from line c-c. FIG. 1 shows a conventional T-shaped gate structure 102 formed over a layer of semiconductor material 104. FIG. 1 also depicts an SOI implementation where the layer of semiconductor material 104 is disposed on a buried oxide ("BOX") layer 118, and where the BOX layer 118 is disposed on a silicon substrate 120. The processing steps described herein are associated with the layer of semiconductor material 104, and do not relate to the underlying BOX layer 118 or silicon substrate 120. For the sake of brevity, further figures will not show the BOX or silicon substrate layers. However, in describing below the preferred embodiment of the invention incorporating an SOI process technology, the BOX and silicon substrate layers are assumed to exist.

Referring to transistor device 100 of FIG. 1, a source 106, a drain 108, and a body tie 110 are formed in the layer of semiconductor material 104. The transistor body is formed in the layer of semiconductor material 104 underlying T-shaped gate structure 102. The portion of the transistor body separating source 106 from drain 108 represents the intrinsic body region 112, and the portion of the transistor body separating source 106 and drain 108 from body tie 110 represents the extrinsic body region 114.

As used herein, the term "length," when used to describe a dimension of a gate or a gate's underlying body or channel region, refers to the feature's short dimension (e.g., in this example, the length of various portions of the transistor body are the distance from source 106 to drain 108, distance from source 106 to body tie 110, and distance from drain 108 to body tie 110). Manufacturing design rules typically constrain the minimum length of extrinsic body region 114 to longer than the minimum length of intrinsic body region 112. Consequently, halo implantation of extrinsic body region 114 and intrinsic body region 112 leaves the longer extrinsic body region 114 more lightly doped than intrinsic body region 112 due to layout geometry, leading to different channel inversion characteristics for the regions. The greater doping in the intrinsic body region 112 is indicated by the stippling in FIG. 1b. The different channel inversion characteristics, in turn, lead to distortion of the voltage applied at body tie 110 as seen at intrinsic body region 112.

FIGS. 2-5 schematically illustrate an embodiment of a body tie test structure and process steps for its manufacture. For a typical application, body tie test structure 500 (see FIG. 5a) is a MOS transistor device that is fabricated in the scribe region of a semiconductor wafer and used for test purposes. While body tie test structure 500 is primarily used for testing purposes, there may be functional applications where the use of such a device is appropriate. In this illustrative embodiment only a small portion of the MOS transistor is illustrated. Various steps in the manufacture of MOS devices are well known and so, in the interest of brevity, many conventional steps will only be mentioned briefly herein or will be omitted entirely without providing the well known process details.

FIG. 2 depicts an intermediate stage in the manufacturing process, after an isotropic etch of a layer of semiconductor material, wherein only an active area 206 of semiconductor material is retained. The etch procedure is followed by the formation of a layer of shallow trench isolation 204 ("STI"— an insulator, such as a silicon oxide, typically deposited by a chemical vapor deposition (CVD) process) in the etched space around active area 206.

Figure 2A:
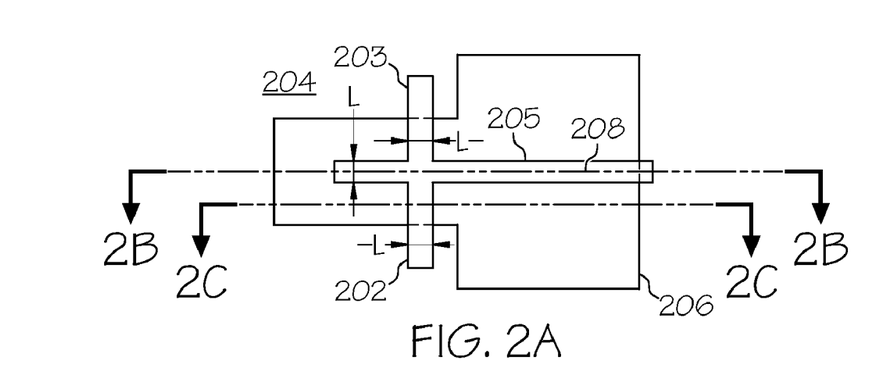

STI formation is followed by the creation of a cross-shaped gate structure 202 atop active area 206. Cross-shaped gate structure 202 comprises a gate electrode 212 (typically formed from polysilicon or metal) formed on a thin gate dielectric 210 (typically formed from a silicon oxide or high-K dielectric material). Cross-shaped gate structure 202 comprises two intersecting cross bars, the cross bars having a substantially constant gate length L (as indicated in FIG. 2a). In the preferred embodiment, the cross bars are oriented perpendicular to one other. A first cross bar 203 (depicted as the vertical segment of cross-shaped gate structure 202 in FIG. 2a) is formed so as to reach the edge or extend beyond the edge of active area 206 on both ends of the cross bar 203. A second cross bar 205 (depicted as the horizontal segment of cross-shaped gate structure 202 in FIG. 2a) is formed so as to reach the edge or extend beyond the edge of active area 206 on one end of the cross bar 205, but to stop short of the edge of active area 206 on the other end of the cross bar 205.

Figure 2B:
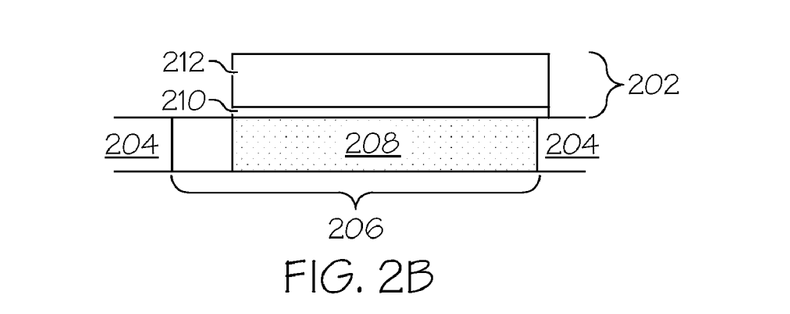
Figure 2C:
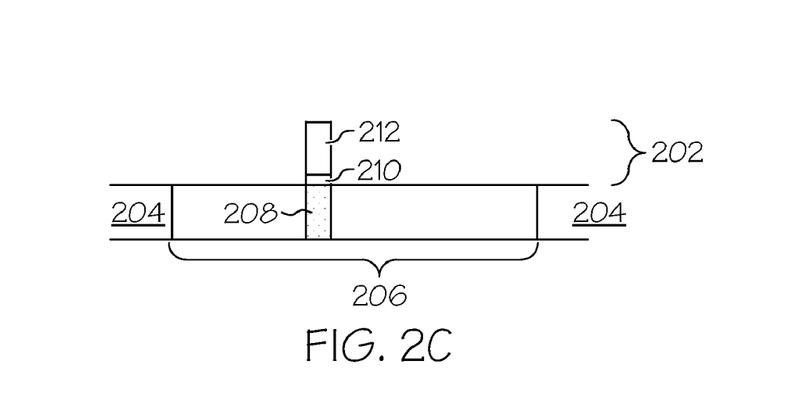

A cross-shaped body region 208 is defined in the region of active area 206 corresponding to the overlapping cross-shaped gate structure 202. After formation of cross-shaped gate structure 202, a halo implant indicated by the stippling in FIG. 2b and FIG. 2c is formed in cross-shaped body region 208 using well known halo implantation techniques. Typically, four tilted halo implants performed at 90 degree offsets are required to complete halo implantation in the cross-shaped body region 208 underlying the perpendicular cross bars 203/205 of cross-shaped gate structure 202. The halo implant is of the same conductivity type as active area 206 (e.g., N-type implant for a PMOS device and P-type implant for an NMOS device). Since the cross bars 203/205 of gate structure 202 have a substantially constant gate length, the doping profile resulting from the halo implant is substantially constant throughout cross-shaped body region 208.

Figure 3A:
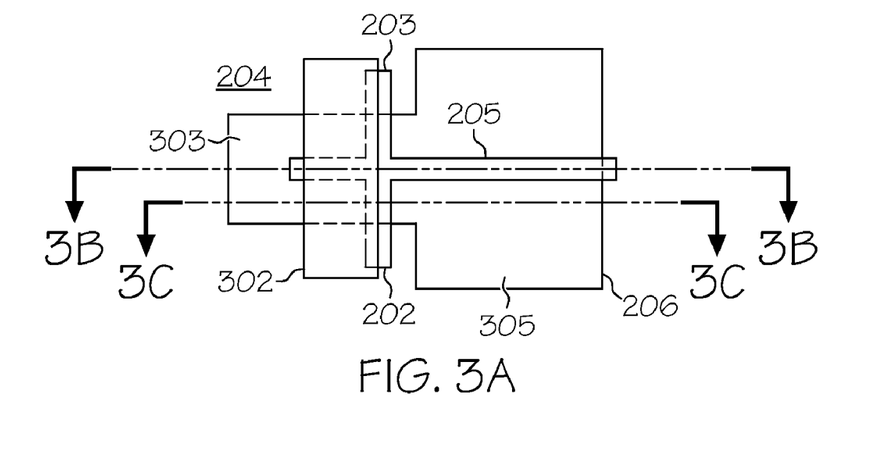
Figure 3B:
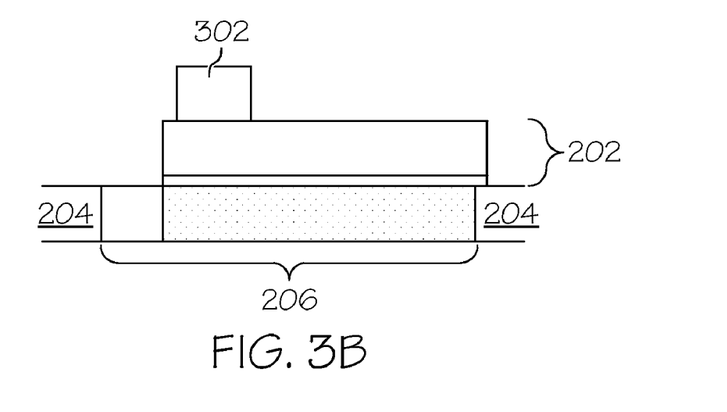
Figure 3C:
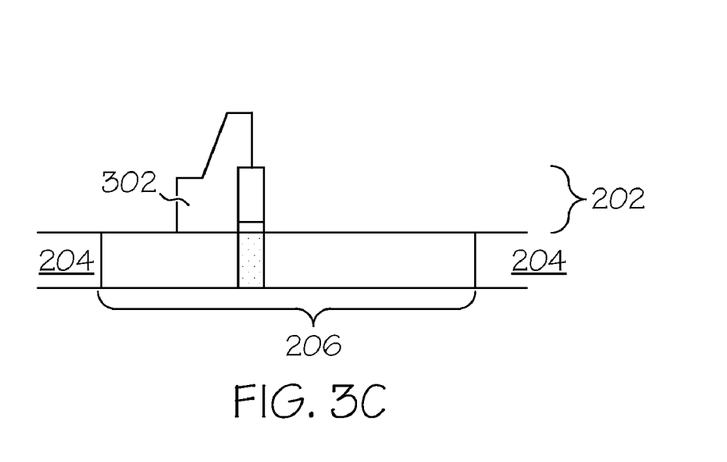

FIG. 3 shows the formation of a blocking layer 302 on top of active area 206 and cross-shaped gate structure 202. Blocking layer 302 is an insulating layer, formed so as to divide active area 206 into two regions 303/305 as viewed from above (as shown in FIG. 3a). Blocking layer 302 completely overlaps the region of active area 206 adjacent to the first (vertical) cross bar 203 of cross-shaped gate structure 202 as viewed from above. Blocking layer 302 does not overlap either end of the second (horizontal) cross bar 205 of cross-shaped gate structure 202.

Examples of material suitable for forming blocking layer 302 include, but are not limited to, silicon oxide ($SiO_X$, where $0<X$), silicon nitride ($Si_XN_Y$, where $0<X$ and $0<Y$), silicon oxynitride ($SiO_XN_Y$, where $0<X$ and $0<Y$), and combinations thereof The blocking layer is typically formed by chemical vapor deposition.

Figure 4A:
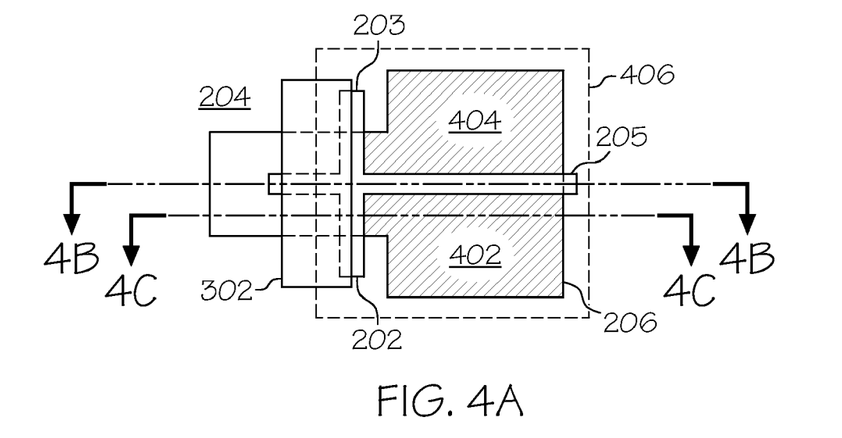
Figure 4B:
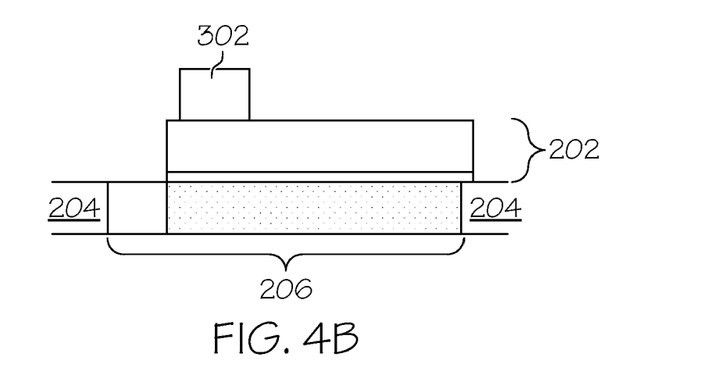
Figure 4C:
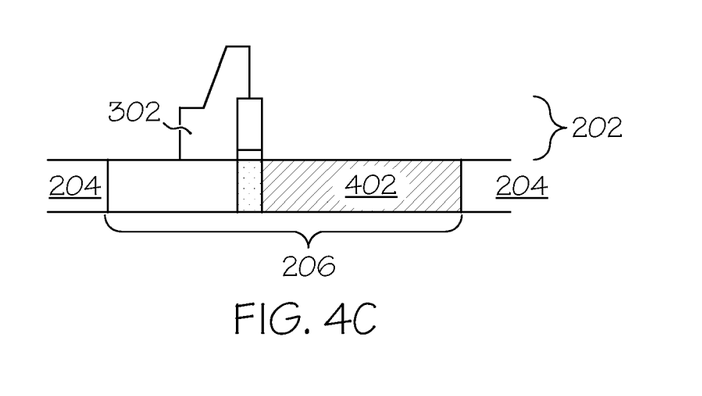

FIG. 4 illustrates the formation of source region 402 and drain region 404 in active area 206. Source and drain formation begins with the formation of ion implantation mask 406 (shown only in FIG. 4a). Ion implantation mask 406 (typically a layer of patterned photoresist material) is formed atop the structures outside its boundary, so that the regions unprotected by ion implantation mask 406 are fully exposed from above, while the remaining regions are completely masked. The formation of ion implantation mask 406 is followed by ion implantation to form source region 402 and drain region 404. Ion implantation mask 406 and cross-shaped gate structure 202 block ion implantation in the underlying regions of active area 206. For this embodiment, the layer of semiconductor material is characterized by a relatively light excess minority carrier concentration, and ion implantation of source region 402 and drain region 404 are performed to achieve a relatively heavy excess majority carrier concentration (e.g., a heavy N-type implant for a NMOS device and a heavy P-type implant for a PMOS device) in the doped regions. After ion implantation of source region 402 and drain region 404 is complete, ion implantation mask 406 is removed. The resulting source region 402 and drain region 404 are electrically interchangeable.

Figure 5A:
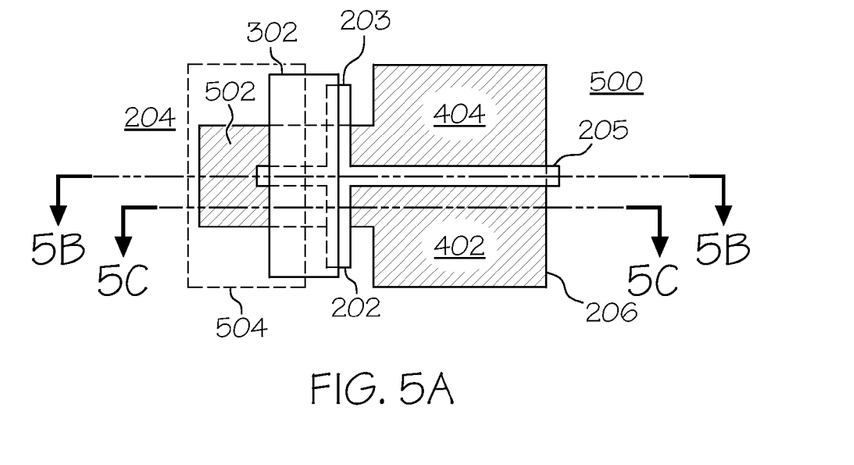
Figure 5B:
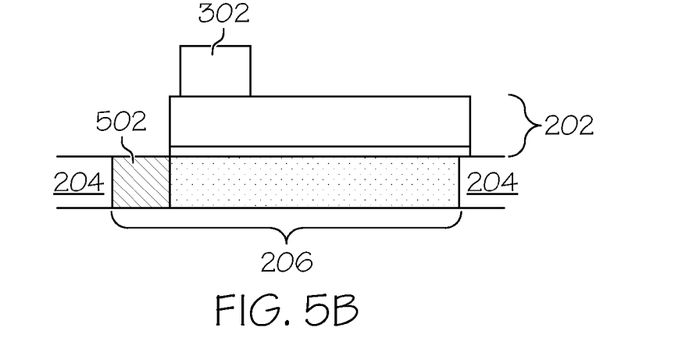
Figure 5C:
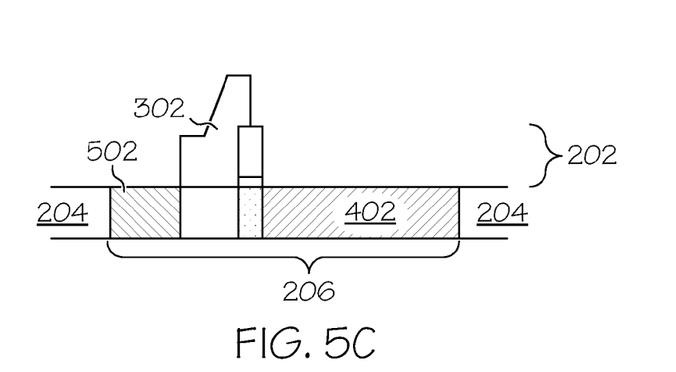

FIG. 5 illustrates the formation of body tie region 502 in active area 206. Body tie formation begins with the formation of ion implantation mask 504 (shown only in FIG. 5a). Ion implantation mask 504 (typically a layer of patterned photoresist material) is formed atop the structures outside its boundary, so that unprotected regions are fully exposed from above, while the regions outside its boundary are completely masked. The formation of ion implantation mask 504 is followed by ion implantation of a dopant to form body tie region 502. Ion implantation mask 504 and cross-shaped gate structure 202 block ion implantation in the underlying regions of active area 206. Ion implantation of body tie region 502 is performed to achieve a heavy excess minority carrier concentration (e.g., a heavy P-type implant for a NMOS device and a heavy N-type implant for a PMOS device) in the doped region. After ion implantation of body tie region 502 is complete, ion implantation mask 504 is removed.

The role of blocking layer 302 during the formation of source region 402, drain region 404, and body tie region 502 is to prevent ion implantation in active area 206 underlying blocking layer 302. After source/drain and body tie ion implantation, an extended undoped (except for the dopant initially in layer 208 and that added by the halo implantations) spacer region results in active area 206 separating source region 402 and drain region 404 from body tie region 502. For this embodiment, the spacer region is characterized by a relatively light excess minority carrier concentration. This spacer region 606 is further illustrated in FIG. 6.

Figure 6A:
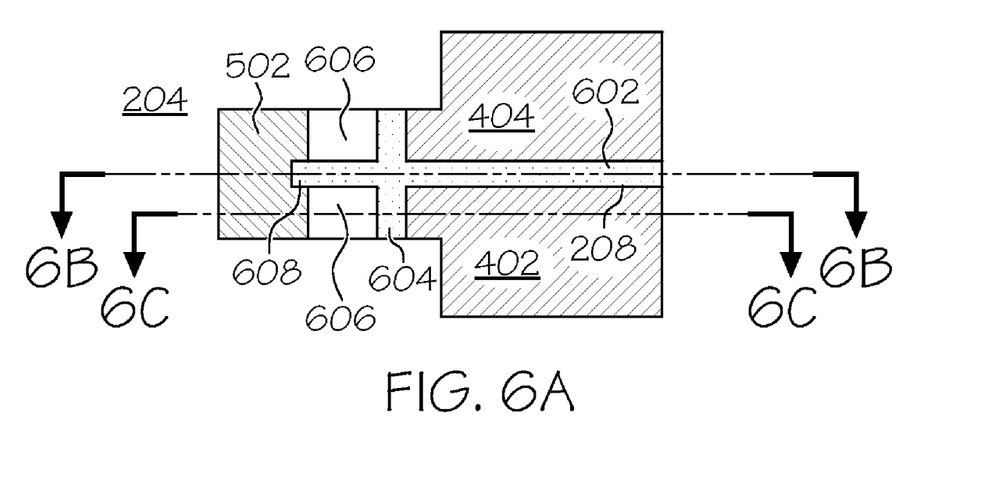
Figure 6B:
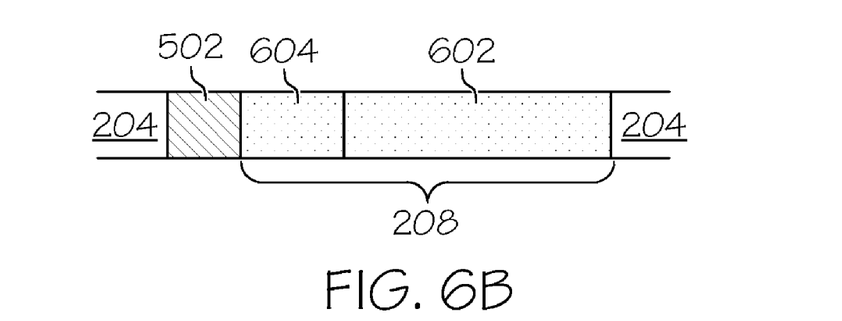
Figure 6C:
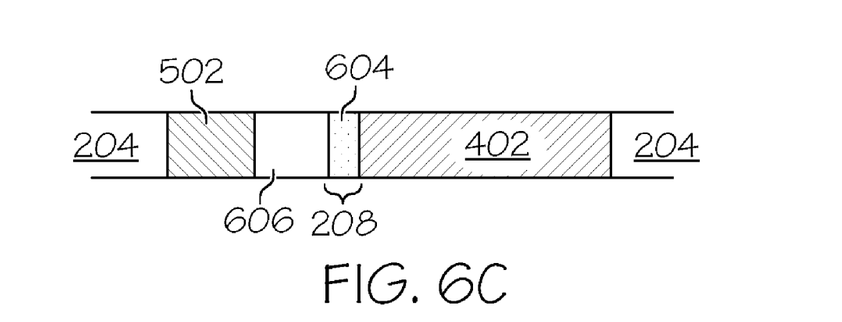

FIG. 6 illustrates active area 206 of FIG. 5 with blocking layer 302 and cross-shaped gate structure 202 removed. In a practical embodiment, blocking layer 302 and cross-shaped gate structure 202 are not actually removed. FIG. 6 simply shows active area 206 without blocking layer 302 and cross-shaped gate structure 202 to facilitate description. With the overlapping layers removed, spacer region 606 is clearly visible in FIG. 6a. The use of the blocking layer to form spacer region 606 overcomes the design rule limitations that would otherwise prevent the formation of a cross-shaped gate with a substantially constant gate length L. Cross-shaped gate structure 202 of FIG. 5 corresponds to cross-shaped body region 208 of FIG. 6, cross-shaped body region 208 being formed in active area 206.

Cross-shaped body region 208 of FIG. 6 comprises intrinsic body region 602 separating source region 402 from drain region 404. Intrinsic body region 602 is the portion of the transistor's body region where the transistor's conductive channel is formed when the transistor is switched "on." Cross-shaped body region 208 further comprises extrinsic body region 604 separating source region 402 from spacer region 606 and separating drain region 404 from spacer region 606. Extrinsic body region 604 comprises cross head 608 extending from intrinsic body region 602 through spacer region 606 to body tie region 502. Cross head 608 connects body tie region 502 to intrinsic body region 602 in a conductive channel with substantially the same inversion properties as intrinsic body region 602. Since cross-shaped body region 208 has substantially constant inversion characteristics throughout the entire body region, a bias voltage applied to body tie region 502 reaches intrinsic body region 602 undistorted by cross head 608, allowing for accurate measurement and modeling of the transistor's body effect.

Figure 7A:
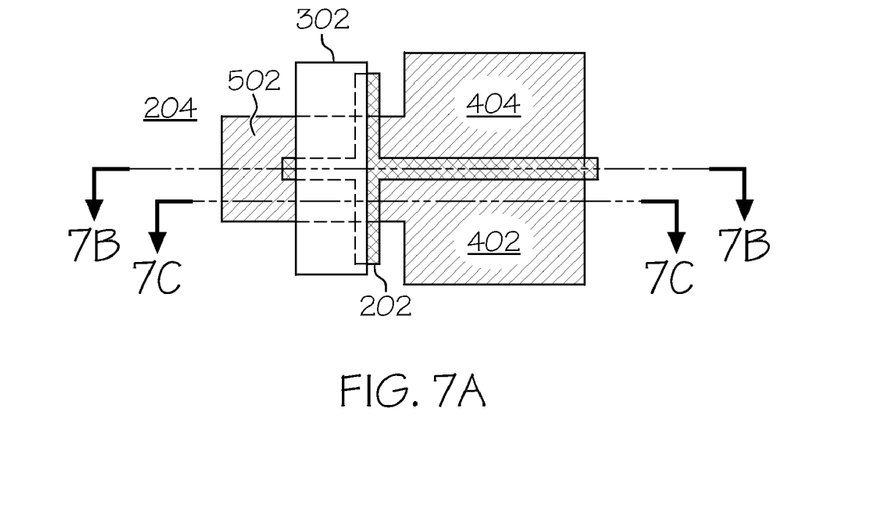
Figure 7B:
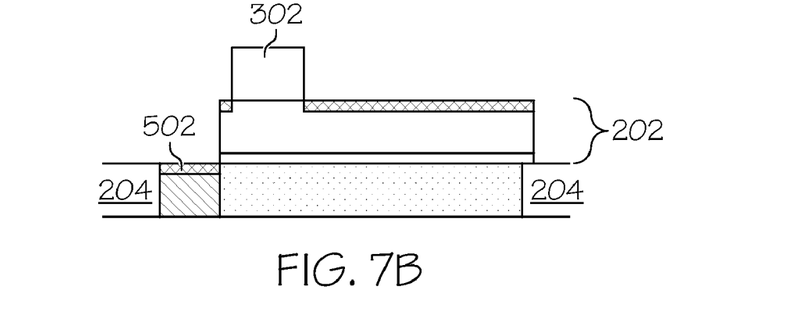
Figure 7C:
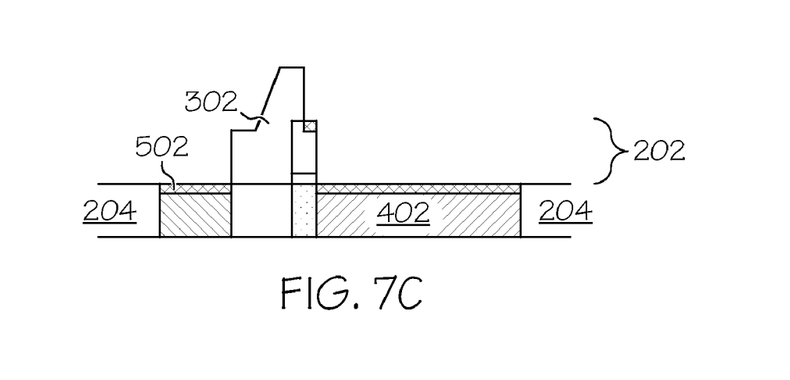

In FIG. 7, the result of salicide formation (typically by a thermal annealing procedure) is illustrated. Salicide formation occurs on exposed regions of semiconductor material (e.g., active area 206 and cross-shaped gate structure 202). FIG. 7 shows salicide formed on the body tie region 502, source region 402, drain region 404, and the portion of cross-shaped gate structure 202 not covered by blocking layer 302. Salicide is typically formed on semiconductor structures to improve conductivity. After salicide formation, further conventional back end processes as are known (e.g., metallization, chemical-mechanical planarization, etc.) may then be carried out to complete the transistor.

The role of blocking layer 302 in salicide formation is to prevent a source-to-drain short circuit. As described above with reference to FIG. 4, blocking layer 302 blocks source and drain implants in the region of active area 206 underlying the blocking layer. Without blocking layer 302, the source and drain implants would diffuse into the region of active area 206 left exposed in the absence of blocking layer 302. This diffusion would extend source region 402 and drain region 404 in active area 206 across the first (vertically depicted) cross bar, into spacer region 606 of FIG. 6. As described above with reference to FIG. 5, blocking layer 302 blocks the body tie implant in the region of active area 206 underlying the blocking layer. Without blocking layer 302, the body tie implant would diffuse into the region of active area 206 left exposed in the absence of missing blocking layer 302. This diffusion would extend body tie region 502 in active area 206, into spacer region 606 of FIG. 6, in the direction of the extended source and drain regions. The diffusion extensions would result in the formation of a reverse diode junction between the body tie region 502 and the extended source region, and the formation of a reverse diode junction between body tie region 502 and the extended drain region. Under normal transistor biasing, only reverse leakage current would flow across these junctions. However, as described above, with the addition of salicide, a continuous conductive layer would be formed atop active area 206. This continuous conductive layer would then electrically bridge the extended source region to the extended drain region through body tie region 502, resulting in a short circuit between the extended source region and extended drain region. The addition of blocking layer 302 prevents the short circuit by blocking ion implantation and salicide formation in the above described regions.

Body tie test structure 500 may be used to accurately observe the body effect of an equivalent floating body transistor. Since, as previously described, an external voltage applied to body tie region 502 reaches intrinsic body region 602 undistorted, the body of the equivalent floating body transistor can be biased with a known voltage, and an undistorted measurement of the body effect can be made. Referring to FIG. 5, the body of the equivalent floating body transistor device may be connected through body tie region 502, the source through source region 402, the drain through drain region 404, and the gate through cross-shaped gate structure 202. The body effect measurement is typically made by sweeping $V_{BS}$ for various values of $V_{GS}$, and observing $I_{DS}$ for a given $V_{DS}$ to discover the dependency of the transistor's threshold voltage $V_{th}$ on the transistor's body-source voltage $V_{BS}$.

Figure 8A:
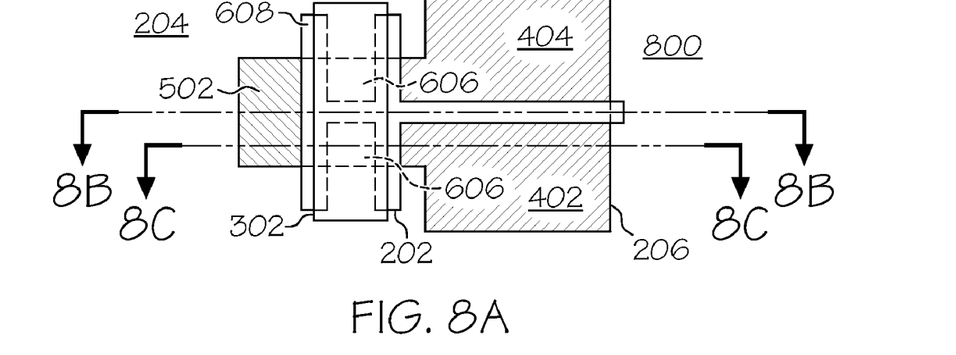
Figure 8B:
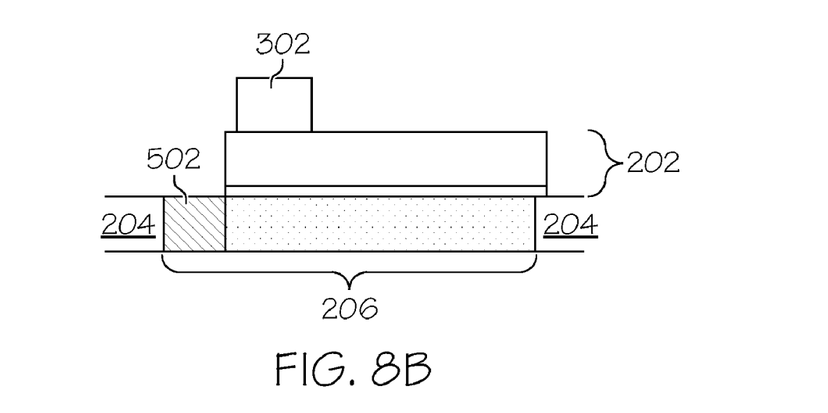
Figure 8C:
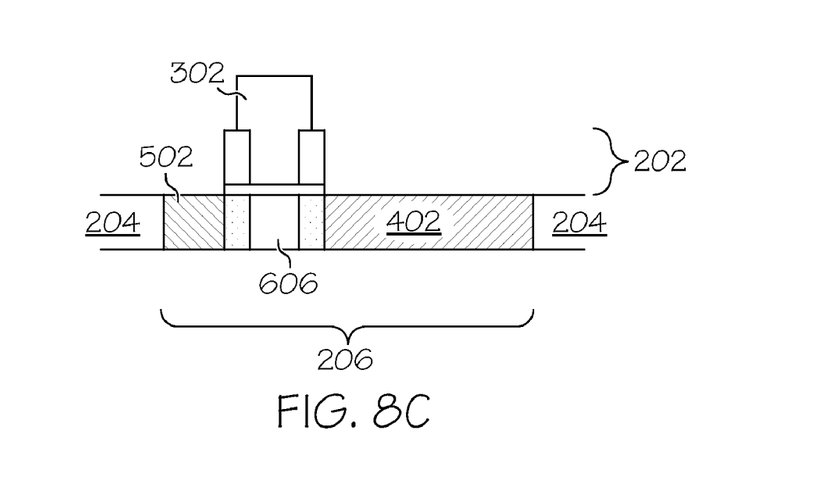

In the illustrative example above, a single cross bar is formed to separate source region 402 and drain region 404 from body tie region 502, and cross head 608 extends between intrinsic body region 602 and body tie region 502. FIG. 8 illustrates a further embodiment, body tie test structure 800, wherein an additional cross bar, also characterized by gate length L, is formed between source region 402 and body tie region 502 and between drain region 404 and body tie region 502. In this example, cross head 608 of cross-shaped gate 202 is T-shaped. As shown in FIG. 8, blocking layer 302 does not overlap the end of cross-shaped gate structure 202 adjacent to body tie region 502.

Each component of body tie test structure 500 is duplicated in body tie test structure 800, including cross-shaped gate structure 202, source region 402, drain region 404, body tie region 502, blocking layer 302, and spacer region 606. Since ion implantation and salicidation are self-aligned procedures, the procedures achieve results within smaller tolerances when a feature edge is defined by a gate structure than when defined by an insulating layer such as blocking layer 302. The use of T-shaped cross head 608 allows for tighter manufacturing control of ion implantation and later salicidation of body tie region 502, since, as shown in FIG. 8, the edge of body tie region 502 adjacent to the remainder of body tie test structure 800 is defined by T-shaped cross head 608 of cross-shaped gate structure 202 (a gate structure) rather than by blocking layer 302 (an insulating layer). After the structures depicted in FIG. 8 are formed, further conventional back end processes as are known (e.g., metallization, chemical-mechanical planarization, etc.) may then be carried out to complete the transistor.

While at least one example embodiment has been presented in the foregoing detailed description, it should be appreciated that a vast number of variations exist. It should also be appreciated that the example embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device, comprising:
   a layer of semiconductor material;
   a source region formed in the layer of semiconductor material;
   a drain region formed in the layer of semiconductor material;
   a spacer region formed in the layer of semiconductor material;
   a body tie region formed in the layer of semiconductor material; and
   a cross-shaped body region formed in the layer of semiconductor material, the cross-shaped body region comprising:
       an intrinsic body region separating the source region from the drain region, the intrinsic body region being characterized by a channel length L; and
       an extrinsic body region separating the source region from the spacer region, and separating the drain region from the spacer region, the extrinsic body region being characterized by the channel length L, and the extrinsic body region comprising a cross head extending from the intrinsic body region through the spacer region to the body tie region.

2. The semiconductor device of claim 1, further comprising a cross-shaped gate structure formed over the cross-shaped body region.

3. The semiconductor device of claim 1, wherein the cross head is T-shaped.

4. The semiconductor device of claim 3, wherein the cross head separates the spacer region from the body tie region.

5. The semiconductor device of claim 1, wherein the body tie region is formed adjacent to the spacer region.

6. The semiconductor device of claim 1, wherein the intrinsic body region and the extrinsic body region are characterized by substantially constant inversion properties.

7. The semiconductor device of claim 1, wherein:
   the layer of semiconductor material and the spacer region are characterized by a light excess minority carrier concentration;
   the source region and the drain region are characterized by a heavy excess majority carrier concentration;
   the body tie region is characterized by a heavy excess minority carrier concentration; and
   the cross-shaped body region is characterized by an excess minority carrier concentration heavier than that of the layer of semiconductor material and the spacer region, and an excess minority carrier concentration lighter than that of the body tie region.

8. The semiconductor device of claim 1, further comprising:
   a buried oxide (BOX) layer, the layer of semiconductor material disposed on the BOX layer; and
   a silicon substrate, the BOX layer disposed on the silicon substrate.

9. A semiconductor body tie test structure comprising:
   a layer of semiconductor material;
   a source region formed in the layer of semiconductor material;
   a drain region formed in the layer of semiconductor material;
   a cross-shaped gate structure formed on the layer of semiconductor material, the cross-shaped gate structure having an intrinsic section and an extrinsic section having substantially the same gate length L;
   a cross-shaped body region formed in the layer of semiconductor material, the cross-shaped body region corresponding to the cross-shaped gate structure, the cross-shaped body region having an intrinsic body region and an extrinsic body region;
   a spacer region formed in the layer of semiconductor material, the spacer region formed adjacent to the extrinsic body region; and
   a body tie region formed in the layer of semiconductor material, the body tie region formed adjacent to the spacer region.

10. The semiconductor device of claim 9, wherein the source region is separated from the drain region by the intrinsic body region.

11. The semiconductor device of claim 9, further comprising:
   salicide formed on the source region and the drain region;
   salicide formed on the body tie region; and
   salicide formed on the cross-shaped gate structure where the cross-shaped gate structure does not overlap the spacer region.

12. The semiconductor device of claim 9, further comprising:
   a buried oxide (BOX) layer, the layer of semiconductor material disposed on the BOX layer; and
   a silicon substrate, the BOX layer disposed on the silicon substrate.

* * * * *